United States Patent
Ahn et al.

(10) Patent No.: US 6,424,034 B1
(45) Date of Patent: Jul. 23, 2002

(54) HIGH PERFORMANCE PACKAGING FOR MICROPROCESSORS AND DRAM CHIPS WHICH MINIMIZES TIMING SKEWS

(75) Inventors: Kie Y. Ahn, Chappaqua, NY (US); Leonard Forbes, Corvallis, OR (US); Paul Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/144,197

(22) Filed: Aug. 31, 1998

(51) Int. Cl.[7] .......................... H01L 23/48; H01L 23/52; H01L 29/40
(52) U.S. Cl. .................. 257/723; 257/777; 257/685; 257/686
(58) Field of Search .................. 257/723, 777, 257/685, 686, 698

(56) References Cited

U.S. PATENT DOCUMENTS

| | | |
|---|---|---|
| 3,959,047 A | 5/1976 | Alberts et al. |
| 3,982,268 A | 9/1976 | Anthony et al. ............... 357/55 |
| 4,081,701 A | 3/1978 | White, Jr. et al. .......... 307/355 |
| 4,394,712 A | 7/1983 | Anthony et al. ............ 361/411 |
| 4,595,428 A | 6/1986 | Anthony et al. ............ 148/187 |
| 4,653,025 A | 3/1987 | Minato et al. .............. 365/154 |
| 4,862,322 A | 8/1989 | Bickford et al. |
| 4,870,470 A | 9/1989 | Bass, Jr. et al. ........... 357/23.5 |
| 4,939,568 A | * 7/1990 | Kato et al. ................... 257/724 |
| 4,977,439 A | 12/1990 | Esquivel et al. ............... 357/49 |
| 4,984,358 A | 1/1991 | Nelson |
| 5,061,987 A | 10/1991 | Hsia ........................... 357/71 |
| 5,079,618 A | 1/1992 | Farnworth ................... 357/81 |
| 5,229,327 A | 7/1993 | Farnworth ................... 437/209 |
| 5,275,001 A | 1/1994 | Yokotani et al. .............. 62/3.7 |
| 5,297,071 A | 3/1994 | Sugino |

(List continued on next page.)

FOREIGN PATENT DOCUMENTS

| JP | 62-97345 | * 5/1987 | |
| JP | 62-156848 | * 7/1987 | |
| JP | 3-49246 | * 3/1991 | |
| JP | 4-133472 | 5/1992 | |
| JP | 5-326832 | * 12/1993 | ............. 257/777 |

(List continued on next page.)

OTHER PUBLICATIONS

Beddingfield et al., "Flip Chip Assembly of Motorola Fast Static RAM Known Good Die", 1997 Proceedings, 47th Electronic Components and Technology Conference, San Jose, CA, 643–648 (May 18–21, 1997).

Blalock et al., "A High–Speed Clamped Bit–Line Current-–Mode Sense Amplifier", *IEEE Journal of Solid–State Circuits*, 26(4), 542–548, (Apr. 1991).

(List continued on next page.)

*Primary Examiner*—Jhihan B Clark
(74) *Attorney, Agent, or Firm*—Dickstein Shapiro Morin & Oshinsky, LLP

(57) ABSTRACT

A method and apparatus for packaging microprocessors and memory devices on a single silicon substrate is described. Microprocessors and memory devices are placed on both sides of the silicon substrate. Through holes are formed in the substrate to connect the microprocessor and memory devices together. By packaging the microprocessor and memory element this way, the propagation length between the memory and the microprocessors is shortened, and timing skews are minimized, and data transmission speed is increased. In addition, additional active and passive circuits and/or components can also be fabricated in one or both sides of the silicon substrate.

37 Claims, 4 Drawing Sheets

U.S. PATENT DOCUMENTS

| | | | |
|---|---|---|---|
| 5,313,503 A | 5/1994 | Jones et al. | |
| 5,317,197 A | 5/1994 | Roberts | 257/401 |
| 5,374,196 A | 12/1994 | Horine | |
| 5,392,407 A | 2/1995 | Heil et al | 395/325 |
| 5,399,898 A | 3/1995 | Rostoker | |
| 5,409,547 A | 4/1995 | Watanabe et al. | 136/204 |
| 5,415,699 A | 5/1995 | Harman | 138/238 |
| 5,432,823 A | 7/1995 | Gasbarro et al. | 375/356 |
| 5,483,421 A | 1/1996 | Gedney et al. | |
| 5,506,499 A | 4/1996 | Puar | |
| 5,576,519 A | 11/1996 | Swamy | |
| 5,587,119 A | 12/1996 | White | 264/104 |
| 5,598,031 A | 1/1997 | Groover et al. | 257/668 |
| 5,608,610 A | 3/1997 | Brzezinski | |
| 5,610,366 A | 3/1997 | Fleurial et al. | 136/202 |
| 5,618,752 A | 4/1997 | Gaul | 438/626 |
| 5,635,767 A * | 6/1997 | Wenzel et al. | 257/778 |
| 5,646,067 A | 7/1997 | Gaul | 437/180 |
| 5,657,481 A | 8/1997 | Farmwald et al. | 395/55 |
| 5,682,062 A | 10/1997 | Gaul | 257/686 |
| 5,699,291 A | 12/1997 | Tsunemine | 365/149 |
| 5,753,529 A | 5/1998 | Chang et al. | 437/67 |
| 5,767,001 A | 6/1998 | Bertagnolli et al. | 438/455 |
| 5,807,783 A | 9/1998 | Gaul et al. | 438/406 |
| 5,808,878 A | 9/1998 | Saito et al. | |
| 5,815,427 A * | 9/1998 | Cloud et al. | 365/51 |
| 5,821,614 A | 10/1998 | Hashimoto et al. | |
| 5,825,080 A * | 10/1998 | Imaoka et al. | 257/777 |
| 5,866,924 A | 2/1999 | Zhu | |
| 5,872,393 A | 2/1999 | Sakai et al. | |
| 5,872,700 A | 2/1999 | Collander | |
| 5,898,223 A | 4/1999 | Frye et al. | |
| 5,977,640 A | 11/1999 | Bertin et al. | |
| 5,984,691 A | 11/1999 | Brodsky et al. | |
| 5,991,156 A * | 11/1999 | Bond et al. | 361/707 |
| RE36,469 E * | 12/1999 | Wood et al. | 257/685 |
| 6,013,948 A | 1/2000 | Akram et al. | |
| 6,040,203 A | 3/2000 | Bozso et al. | |
| 6,057,598 A * | 5/2000 | Payne et al. | 257/723 |
| 6,137,164 A | 10/2000 | Yew et al. | |

OTHER PUBLICATIONS

Cao et al., "A Novel "Double–Decker" Flip–Chip/BGA Package for Low Power Giga–Hertz Clock Distribution", 1997 Proceedings, 47th Electronic Components and Technology Conference, San Joe, CA, 1152–1157, (May 18–21, 1997).

Crisp, "Development of Single–Chip Multi–GB/s DRAMs", Digest of International Solid–State Circuits Conference, 226–227, (1997).

Crisp, "Rambus Technology, the Enabler", Conference Record of WESCON, Anaheim, CA, 160–165, (Nov. 17–19, 1992).

Demmin, "nCHIP's Silicon Circuit Board Technology", National Electronic Packaging and Production Conference, NEPCON West 94, 3, Proceedings of the Technical Program, 2038–9, (1993).

Donnelly et al., "A 660MB/s Interface Megacell Portable Circuit in –.3 mum–0.7 mun CMOS ASIC", *IEEE Journal of Solid–State Circuits,* 32(12), 1995–2003, (Dec. 1996).

Feinberg et al., "Interposer for Chip–on–Chip Module Attachment", *IBM Technical Disclosure Bulletin,* 26(9), 4590–91, (Feb. 1984).

Foster et al., "High Rate Low–Temperature Selective Tungsten", *Ip: Tungsten and Other Refractory Metals for VLSI Applications III,* V.A. Wells, ed., Materials Res. Soc., Pittsburgh, PA, 69–72, (1988).

Goodman et al., "The Flip Chip Market", *Advanced Packaging,* 24–25, (Sep./Oct. 1997).

Gray et al., "Analysis and Design of Analog and Integrated Circuits", *John Wiley and Sons,* $2^{nd}$ ed., 617–622, (1984).

Heremans et al., "Optoelectronic Integrated Receiver for Inter–MCM and Inter–Chip Optical Interconnects", Technical Digest, International Electron Devices Meeting, 657–660, (Dec. 1996).

Horie et al., "Novel High Aspect Ratio Aluminum Plug for Logic/DRAM LSI's Using Polysilicon–Aluminum Substitute", Technical Digest: IEEE International Electron Devices Meeting, San Francisco, CA, 946–948, (1996).

Horowitz et al., "PLL Design for a 500mbs Interface", Dig. International Solid–State Circuits Conference, 160–161, (1993).

Huth, Next–Generation Memories, *Electronik,* 42(23), 36–44 (1993).

Krishnamoorthy et al., "Ring Oscillators with Optical and Electrical Readout Based on Hybrid GaAs MQW Modulators Bonded to 0.8 Micron Silicon VlSI Circuits", *Electronics Lett. 31*(22), 1917–18, (Oct. 26, 1995).

Lee et al., "A 2.5V Delay–Locked Loop for an 18Mb 500 MB/s DRAM", Digest of International Solid–State Circuits Conference, 300–301, (1994).

Lehmann, "The Physics of Macropore Formation in Low Doped n–Type Silicon", *Journal of the Electrochemical Society,* 140(10), 2836–2843, (Oct. 1993).

Lin et al., "Precision Embedded Thin Film Resistors for Multichip Modules (MCM–D)", Proceedings IEEE Multichip Module Conference, 44–9 (1997).

Mimura et al., "System Module: a New Chip–on–Chip Module Technology", Proceedings of IEEE Custom Integrated Circuit Conference, 439–442, (1997).

Muller et al., "Trench Storage Node Technology for Gigabit DRAM Generations", Digest IEEE International Electron Devices Meeting, San Francisco, CA, 507–510, (Dec. 1996).

Ohba et al., "Evaluation on Selective Deposition of CVD W Films by Measurement of Surface Temperature", In: *Tungsten and Other Refractory Metals for VLSI Applications II,* Materials Research Society, Pittsburgh, PA, 59–66, (1987).

Ohba et al., "Selective Checmial Vapor Deposition of Tungsten Using Silane and Polysilane Reductions", In: *Tungsten and Other Refractory Metals for VLSI Applications IV,* Materials Research Society, Pittsburgh, PA, 17–25, (1989).

Patel et al., "Thermoelectric Cooling Effect in a p–Sb2Te3/n–Bi2Te3 Thin Film Thermocouple", *Solid–State Electronics 35*(9), 1269–72, (1992).

Ramo et al., "Fields and Waves in Communication Electronics", *John Wiley & Sons,* Inc., New York, $3^{rd}$ ed., 428–433, (1994).

Rucker et al., "A High Performance SI on SI Multichip Module Technology", 1992 Symposium on VLSI Technology, Digest of Technical Papers, IEEE, Japanese Society of Applied Physics, 1992, Seattle, WA, 72–73, *Jun. 2–4, 1992).

Sekine et al., "A New High–Density Plasma Etching System Using a Dipole–Ring Magnet", *Jpn. J. Appl. Phys.,* Pt. 1, No. 11, 6274–6278, (Nov. 1995).

Seraphim et al., "Principles of Electronic Packaging", In: *Principles of Electronics Packaging,* McGraw–Hill, New York, NY, 44, 190, 595–597, (1989).

Shafai et al., "A Micro–Integrated Peltier Heat Pump for Localized On–chip Temperature Control", *Canadian Journal of Physics,* 74, Suppl., No. 1, S139–142, (1996).

Shafai et al., "Optimization of Bi2Te3 Thin Films for Microintegrated Peltier Heat Pumps", *Journal of Vacuum Science and Technology A,* Second Series 15, No. 5, Preliminary Program, 44$^{th}$ National Symposium of the AVS, San Jose, CA, 2798–2801, (Sep./Oct. 1997).

Su et al., "Experimental Results and Modeling Techniques for Substrate Noise in Mixed–Signal Integrated Circuits", *IEEE Journal of Solid–State Circuits,* 28(4), 420–430, (Apr. 1993).

Vardaman et al., "CSPs: Hot New packages for cool portable products", *Solid State Technology,* 40(10), 84–89, (Oct. 1997).

Vendier et al., "A 155 Mbps Digital Transmitter Using GaAs Thin Film LEDs Bonded to Silicon Driver Circuits", Digest IEEE/LEOS 1996 Summer Topical Meetings, Advanced Applications of Lasers in Materials and Processing, 15–16, (1996).

Vusirikala et al. "Flip–chip Optical Fiber Attachment of a Monlithic Optical Receiver Chip", SPIE Proceedings (The International Society for Optical Engineering, 2613, 52–58, (Oct. 24, 1995).

* cited by examiner

FIG. 3A
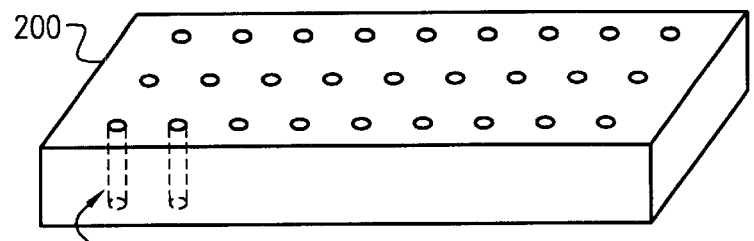
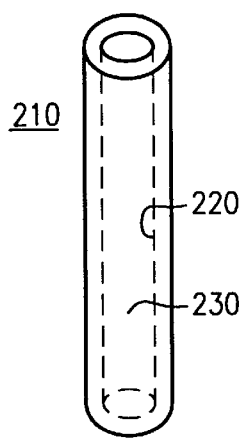
FIG. 3B
FIG. 3C
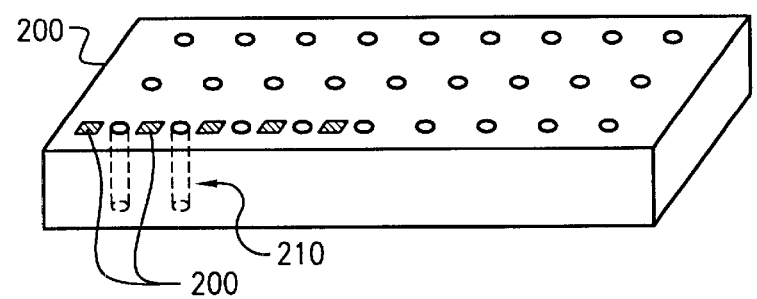
FIG. 3D
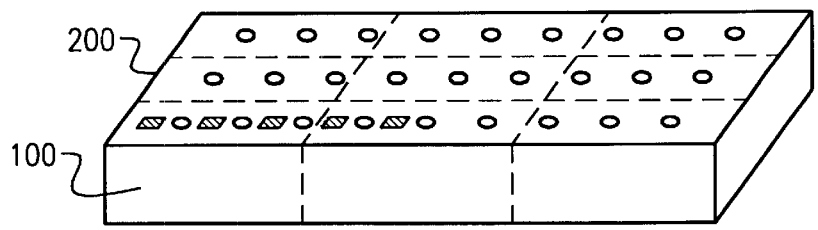
FIG. 3E
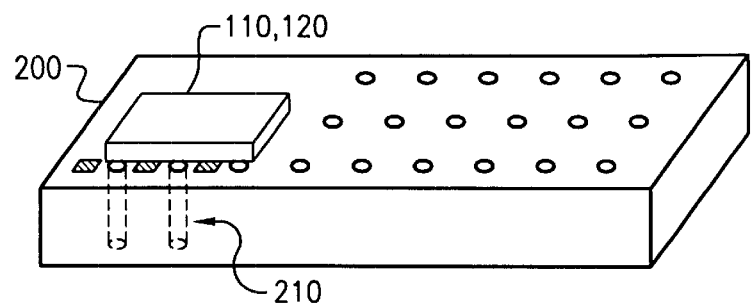

HIGH PERFORMANCE PACKAGING FOR MICROPROCESSORS AND DRAM CHIPS WHICH MINIMIZES TIMING SKEWS

BACKGROUND OF THE INVENTION

1. Field of the Invention

The invention relates to a packaging for holding both microprocessors and memory chips, which increases data access speed and minimizes timing skews by arranging the microprocessors and their associated memories in close proximity to one another.

2. Description of the Related Art

Microprocessors and memory chips are an essential part of almost every computer today. The speed at which a computer performs operations is partially dependent on the speed at which information is transferred between its microprocessor and the memory. There is an ever-increasing need for faster operating computers. By decreasing the time it takes for a microprocessor to access data contained within the memory units, the operating speed of the computer can be increased.

Microprocessors and memories operate in what is called a master-slave relationship. That is, the microprocessor essentially directs the memory operation. This is accomplished through a common bus which connects the microprocessor to the memory. The bus is nothing more than a collection of lines which connect to both the memory and the microprocessor. When a computer seeks to read information from, or write information to, the memory, the address of the particular memory location or locations is placed on the bus and transmitted to the memory. Then, if the microprocessor is reading from the memory, the information stored in the selected locations is transmitted over the bus lines to the microprocessor. If the microprocessor is writing to the memory, information travels from the microprocessor and is stored in the selected memory location(s).

Various types of memories are used in today's computers. Dynamic Random Access Memories (DRAMs) store information dynamically in the form of a stored charge on a capacitor. Since the charge stored on the capacitor has a tendency to leak away over time, the charge must be constantly refreshed. DRAM technology is conventional in the art and is explained in U.S. Pat. No. 4,081,701 to White Jr. et al., which is herein incorporated by reference. DRAMs are beneficial because they provide more input/output (I/O) paths than standard memory devices. Static Random Access Memories (SRAMs) are another type of memory device. SRAMs store information by latching a set of transistors into one of two states, indicative of the associated logic level (i.e., a logic "1" or "0"). Unlike DRAMs, it is not necessary to refresh SRAMs since condition of the memory location is represented by a transistor state, rather than charge stored on a capacitor. SRAM technology is also conventional in the art, and is shown in U.S. Pat. No. 4,653,025 to Minato et al., which is herein incorporated by reference. Both DRAMs and SRAMs provide high data transfer rates, and both are widely used in the art.

Data transmission speeds would be greatly increased if both memory and microprocessors could be packaged on a single chip. The proximity of the circuits limits the travel time of the signals, and increases efficiency. Recently, a "System Module" has been developed which consists of a logic and memory chip stacked on top of one another with their contacts facing each other. This technique has been described, for example, by Yamaguchi et al. in "System module: a new Chip-On-Chip module technology", Proceedings of IEEE 1997 Custom Integrated Circuit Conference, p.439–442, 1997, which is herein incorporated by reference.

The "System Module" is formed by pressing two separate chips 10, 20 (i.e. logic and memory, respectively) together and bonding them, as shown in FIGS. 1A and 1B. FIG. 1A shows the chips prior to be being pressed together. The chips are attached with their contacts 30, 40 facing each other. The connection is formed by placing solder balls 50 on the contact points of the chips, pressing the chips together, and reheating the solder so that it sets. FIG. 1B shows the chips after they have been pressed and heated. This concept is referred to as "micro bump" or "flip chip" bonding. FIGS. 1A and 1B show solder balls on the contacts of both chips, however, it is only required that one chip have solder balls placed on its contacts. In the "System Module", the 'bus' which exchanges information between the logic chip and the memory is actually the solder bump connections. Once the "System Module" has been fabricated, it is placed in a lead frame, or other suitable device, for connection to other devices. The "System Module" provides for high data transfer rates because the logic (10) and the memory (20) chips are in direct contact with very little signal propagation distance therebetween. The disadvantage of this device is that only two chips at a time may be connected in this manner. Further, there is no room for placement of auxiliary circuits, such as active and passive devices which can be used to enhance the performance of the logic and memory circuits.

Although the "System Module" provides a short connection line between the two connected IC chips, it does not allow for the connection of additional circuits. In addition, in order to connect more than one memory and logic circuit together at a time, or to connect auxiliary circuits to the logic circuit or memory, longer connection lines (buses) are needed. Longer connection lines allow more circuits to be connected, but also increase the overall size of the device. Further, long lines cause signal delays and timing skews as explained below.

A major problem which occurs in many microprocessor/memory systems is timing skew. Since vast amounts of data are being transmitted over a bus at any one time, clock signals are used to synchronize various circuits which retrieve or transmit data. Timing skew occurs when respective clock signals, for synchronizing different circuits, do not reach their destination at approximately the same time. Timing skew is usually not a problem in devices which have short data paths and short clock paths, because the respective clock signals often reach their destination at the same time. However, as the length of these lines increases, clock speed must be reduced to compensate for the signal delay caused by the longer data lines. When memory and logic circuits are connected using longer bus lines, timing skew becomes a serious problem, especially at high clock rates.

Many prior art schemes have been developed to deal with timing skew problems. One solution is to use a phase locked loop circuit to synchronize the clock signals. Phase locked loop circuits are often utilized to synchronize clock signals on a chip with clock signals off-chip. A main clock generator determines the rate at which data is being transmitted or received by the computer. Since the main clock generator is usually not placed on the chip, it must travel a certain distance to reach the chip. This inherently means that the clock signal is experiencing some type of delay due to the length it travels. Once the main clock signal reaches the chip it must be synchronized with the on-chip clock generator. The phase locked loop circuit locks on to the off-chip clock and synchronizes it with the clock generator on-chip. This synchronization eliminates timing skew problems which occur due to the length of different clock lines.

There is currently a need for a microchip-memory interconnection system which allows many chips to be connected at once, and which does not suffer from timing skew problems. By connecting together multiple chips through relatively short bus lines, and by using auxiliary circuits, such as phase locked loop circuits, to minimize timing skews, an increase in data transmission rates can be easily achieved.

SUMMARY OF THE INVENTION

The present invention provides a superior method of packaging microprocessors and memory chips on a common silicon chip to form a multi-chip module.

The invention provides a silicon interposer chip package which is capable of carrying multiple IC chips and which does not suffer timing skew problems. This is accomplished by making the interconnection lines between the IC chips relatively short. The invention also provides active and passive circuits within the interposer substrate. These active and passive circuits increase the overall efficiency of the device. The invention also reduces timing skews which occur outside the interposer by utilizing an active circuit, such as a phase locked loop circuit, placed within the interposer substrate.

The above and other advantages and features of the present invention will be better understood from the following detailed description of the preferred embodiment which is provided in connection with the accompanying drawings.

BRIEF DESCRIPTION OF THE DRAWINGS

FIGS. 3A–E show a preferred embodiment of the invention at different stages of fabrication.

DETAILED DESCRIPTION OF THE PREFERRED EMBODIMENTS

Figure 1A:
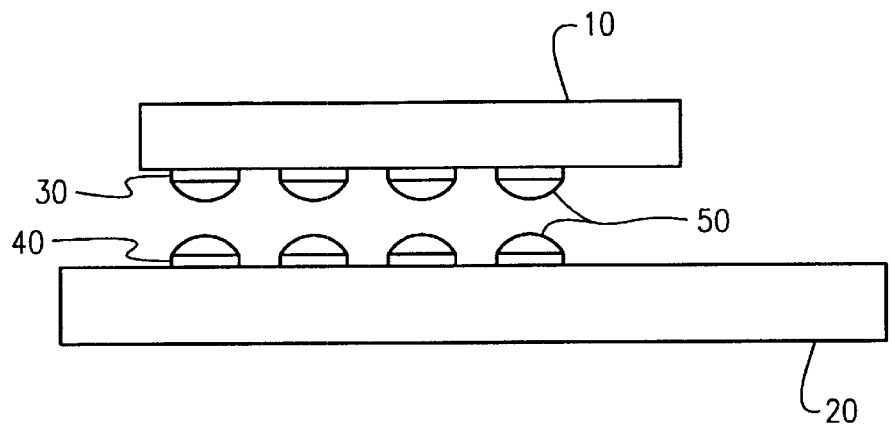
FIGS. 1A and 1B show a conventional "flip chip" bonded package.
Figure 1B:
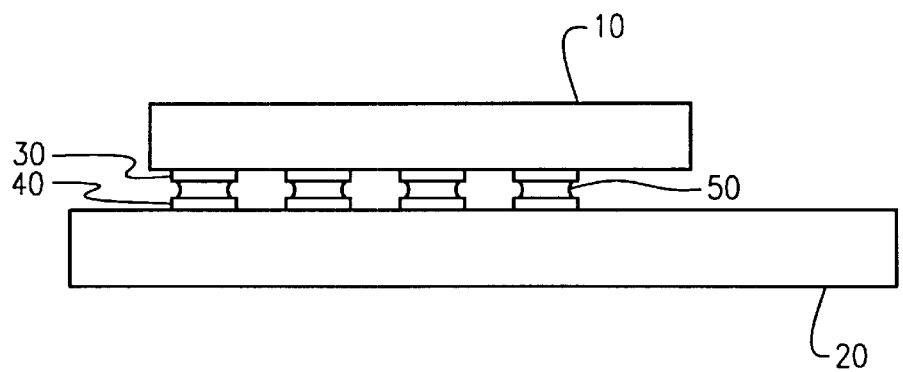
Figure 2:
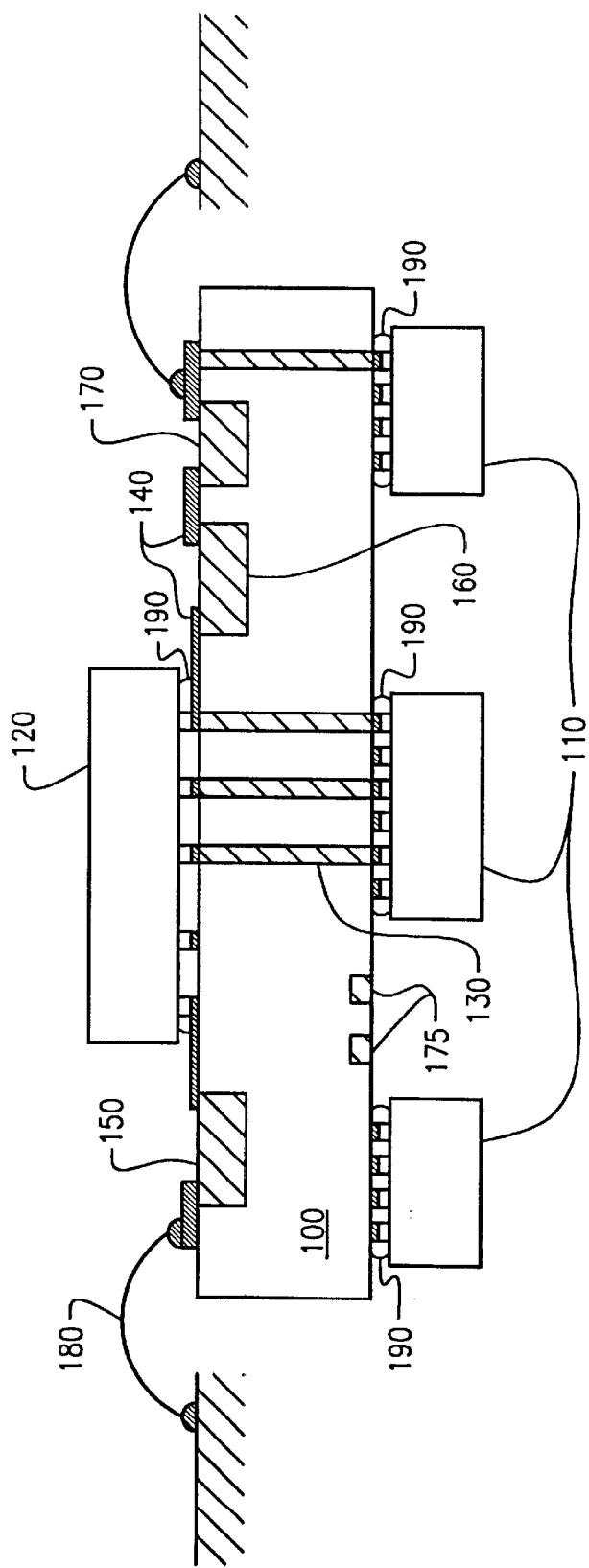
FIG. 2 shows a preferred embodiment of the present invention.

FIG. 2 shows a preferred embodiment of the present invention. Instead of the having the IC chips bonded to one another, as in the prior art (e.g. FIGS. 1A and 1B), they are bonded to a silicon substrate 100 which is interposed between the chips. This silicon interposer substrate 100 is used to carry both memory chips 110 and a microprocessor 120. The interposer substrate 100 is like a large chip which carries a multitude of smaller chips. The memory chips 110 can be any type of conventional memory device, such as DRAMs, SRAMS, or similar devices. The interposer substrate 100 may have active and passive devices built on one or both sides for further increasing data access speed. The connection between the microprocessor and the memory chips is formed by through holes 130 which extend through the interposer substrate 100 from one side to the other. These through holes form a 'bus' for connecting the microprocessor, the memory, and any other elements situated on the interposer substrate 100. Elements on the same surface of the interposer substrate 100 are connected by one or more layers of metallurgy 140 formed on the surface. As shown in FIG. 2, the open space between the chips and interposer substrate 100 is filled with an epoxy 190. The epoxy 190 provides for passivation and improves the fatigue characteristics of the solder joints which exist between the leads of the IC chips 110, 120 and the leads of the interposer substrate 100.

Silicon is a particularly suitable material for forming the interposer substrate 100 for several reasons. Silicon is inexpensive and readily available. Further, the characteristics of silicon match those of the memory 110 and microprocessor 120 chips. Also, silicon has excellent thermal characteristics. In addition to silicon, Gallium Arsenide (GaAs) may also be used for the interposer material.

The construction of the interposer substrate 100 allows both active and passive circuits to be formed within its surface. One example of an active device which can be fabricated on the surface of the chip is a phase locked loop circuit. Such a circuit is shown in FIG. 2 by element 150. As described above, phase locked loops are conventional in the art, and are often used for clock signal generation and synchronization. The phase locked loop can be used in this invention to minimize timing skews which occur outside the interposer substrate 100. In other words, the phase locked loop circuit will synchronize an external clock (off-interposer) with the clock signal on the interposer substrate 100. This allows data to be sent and received by the interposer substrate 100 at more rapid rates. For best results, two phase locked loops may be placed within the interposer substrate 100, one for synchronizing the interposer clock when transmitting information and one for synchronizing the interposer clock when receiving information.

Other active circuits such as phase voltage generators, voltage regulators, line drivers, multiplexers, input/output drivers, power conditioners, and switching circuits may also be formed in the interposer substrate 100. For example, in FIG. 2, area 160 represents a driver circuit, and area 170 represents a power conditioning circuit. The driver circuit 160 might comprise a differential line driver for reducing the voltage swing on off-chip lines. Power conditioning circuits would include such devices as voltage regulators and filters. Passive circuits 175, such as resistors and capacitors, can also be formed in the interposer substrate 100. The active and passive circuits may be placed only on a single side of the interposer substrate 100, or may be placed on both sides. From a processing standpoint it would be simpler to form only passive circuits on one side of the interposer substrate 100 and only active circuits on the other side. This is because the process required to form active circuits is different than the one required for passive circuits. However, it is possible to process both sides of the interposer substrate 100 simultaneously to form active and passive circuits on both sides.

The key problem with operating memories and microprocessors at high data rates is controlling timing skews. Timing skews limit the ability of a computer to process data quickly. This problem is partially solved by decreasing the distance between the sender and receiver of information, in this case the microprocessor and the memory. A normal signal delay would be 1 ns/foot or 30 ps/cm, where the dielectric material is air. When the dielectric is silicon however, these propagation delays become much longer. These delays become troublesome at high clock rates, such as 500 MHz and above. Mounting the memory chips and the microprocessors on an interposer substrate 100 which is less than 50 mils or 0.125 cm thick, serves to keep the signal paths short, and timing skews are minimized or eliminated. The phase locked loop circuitry further reduces timing skews which occur when off-chip signals are used.

The process for forming the interposer substrate 100 will next be described with reference to FIGS. 3A–3E. First, as shown in FIG. 3A, a silicon wafer 200, which will ultimately yield many interposer substrates 100, has holes 210 drilled in it which will serve as through holes. The holes 210 are then subjected to an oxide deposition. This oxide deposition forms an oxide layer 220 on the inner surface of the holes 210. The oxide layer serves to create an insulating layer between metal later deposited within the hole and the rest of the interposer substrate 100. After the oxide deposition the holes 210 are filled with a metal conducting substance 230, such as Aluminum (Al), Copper (Cu), Gold (Au) or Silver (Ag). These holes 210 provide a high density/high bandwidth connection between the chips 110, 120 (FIG. 2) attached to the opposite sides of the interposer substrate 100. After the holes 210 are formed and treated, active and passive circuits 240 are formed within the silicon wafer 200, by techniques well known in the art. The silicon wafer 200 with active and passive circuits 240 formed therein is shown in FIG. 3C. Then, one or more levels of metallurgy (not shown) are formed on the surfaces of the interposer substrate 100, as are required. Finally, the silicon wafer 200 is divided into a multitude of interposer substrates 100 (FIG. 2) as shown in FIG. 3D. The dotted lines in FIG. 3D are exemplary dicing lines.

After this, the interposer substrate 100 is ready to have the IC chips 110, 120 mounted on its surface. The chips are mounted to the interposer substrate 100 by a process often called "flip chip" bonding, described above with reference to FIG. 1. Essentially, the chips 110, 120 are flipped upside down and pressed against the interposer substrate 100. The chips have contacts formed on their underside, with solder balls affixed thereon. The interposer substrate 100 has similar contacts formed on its surface. The chips are placed on the interposer substrate 100 so that the contacts face each other, with the solder balls placed between them. Once the chips are placed on the interposer, the device is heated so that the solder will melt and create a reliable bond between the chip contacts and the interposer contacts. As an alternative to the process described above, the IC chips may be mounted to the silicon wafer 200 before it is divided, as shown in FIG. 3E.

The fabricator of such an interposer substrate 100 must also be cognizant of the problems caused when attaching chips by micro bump bonding. The IC chips must be attached to each side separately, and therefore the interposer substrate 100 must be heated twice to melt the solder, once for each side. However, a problem may occur if one of the IC chips (110,120) has already been mounted to one side of the interposer 100. While heating the other side, the solder on the first side will also melt, and may cause the chips on that side to become dislodged. To avoid this problem, the fabricator may use different types of solder with different melting points. For instance, Pb 2.5% solder may be used for the 'bumps' on one side, and Pb-11 Wt % Sb for the 'bumps' on the other side. Further, another different type of solder, like Pb-62 Wt % Sn, may be used for soldering the interposer into a system circuit board. Another way to solve this problem would be to heat the solder bumps locally so that the heating of one side does not cause heating of the opposite side.

Figure 4:
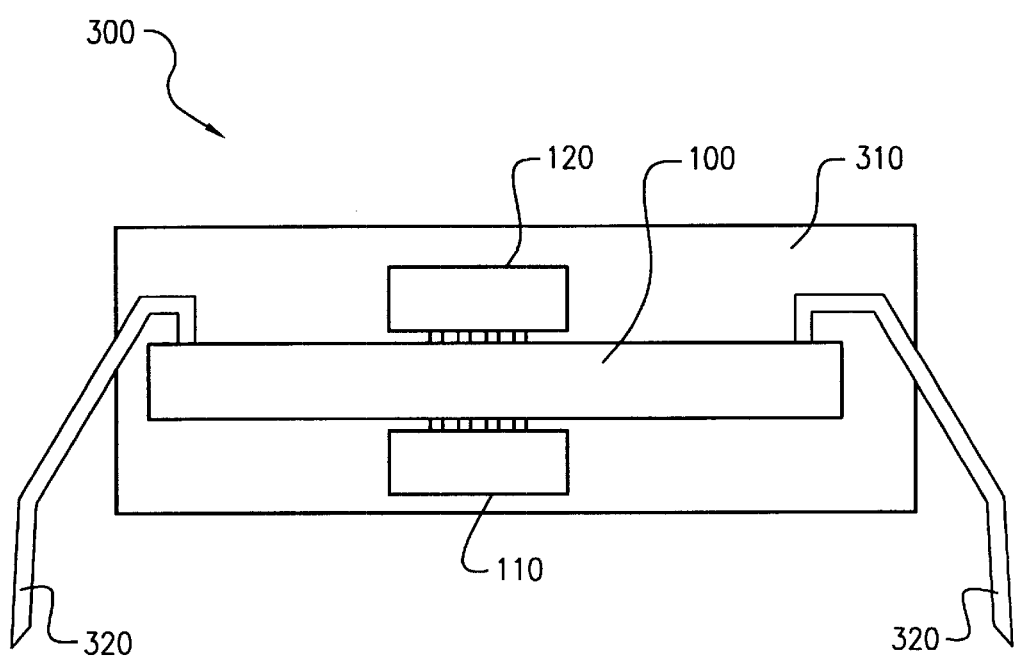

Once the complete interposer substrate 100 has been fabricated it can be mounted on a larger circuit board and/or connected to other elements. As shown in FIG. 2, the interposer substrate 100 is attached to external elements on a system circuit board through wire bonds 180. The mounting of the interposer substrate 100 may be accomplished by mechanical means well-known in the art, such as through the use of a lead frames. FIG. 4 shows a lead frame 300 for carrying the completed interposer substrate 100. The leads 320 of the lead frame will connect to the wire bonds 180 (FIG. 2) coming from the interposer. In order to protect the interposer substrate 100 and the attached IC chips (110,120), the unit may be encapsulated by methods well-known in the art, such as through an epoxy encapsulation 310. Additionally, for further protection, the complete interposer unit may be sealed in container which is vacuum-sealed or filled with an inert gas (not shown).

It should be readily understood that the invention is not limited to the specific embodiment described and illustrated above. Rather, the invention can be modified to incorporate any number of variations, alterations, substitutions or equivalent arrangements not heretofore described, which are commensurate with the spirit and scope of the invention. Accordingly, the invention is not limited by the foregoing description, but is only limited by the scope of the appended claims.

What is claimed is:

1. A chip carrier comprising:
    a silicon substrate having a thickness less than 0.125 centimeters and with at least one circuit device formed within it, said at least one circuit device comprising at least one passive circuit; and
    at least one integrated circuit chip attached to the substrate and electrically connected to said at least one circuit device.

2. The chip carrier of claim 1, wherein said at least one circuit device further comprises at least one active circuit device.

3. The chip carrier of claim 1, wherein said at least one integrated circuit chip is attached to the substrate by soldering.

4. The chip carrier of claim 1, wherein said silicon substrate has a first face and a second face which are opposite each other, conductive regions on said first and second faces being connected through the silicon substrate by conductive through holes.

5. The chip carrier of claim 1, wherein said at least one passive device comprises at least one of a resistor and a capacitor.

6. The chip carrier of claim 1, wherein said at least one integrated circuit chip comprises at least one logic chip attached to the substrate and at least one memory chip attached to the substrate.

7. The chip carrier of claim 1, wherein a bonding agent is located in the area between the said at least one integrated circuit chip and the substrate.

8. The chip carrier of claim 1, wherein said chip carrier is encapsulated.

9. The chip carrier of claim 2, wherein said at least one active circuit device comprises a phase locked loop circuit.

10. The chip carrier of claim 6, wherein said at least one logic chip is attached to a first face of the substrate and said at least one memory chip is attached to a second face of said substrate.

11. The chip carrier of claim 3, where the soldering comprises micro bump bonding.

12. The chip carrier of claim 4, wherein said at least one circuit device is an active circuit device formed in said first face.

13. The chip carrier of claim 6, wherein said at least one logic chip is a microprocessor.

14. The chip carrier of claim 12, wherein at least one passive circuit device is formed in said second face.

15. The chip carrier of claim 7, wherein said bonding agent is epoxy.

16. A processing system comprising:
- a silicon substrate having a thickness less than 0.125 centimeters and having at least one circuit device formed therein;
- a logic device attached to one side of the substrate; and
- at least one memory device attached to an opposite side of the substrate and connected to said logic device through conductive through holes formed in said substrate.

17. The processing system of claim 16, wherein said at least one circuit device comprises at least one active circuit device.

18. The processing system of claim 16, wherein said at least one circuit device comprises at least one passive circuit device.

19. The processing system of claim 16, wherein said logic device is a microprocessor.

20. A chip carrier comprising:
- a silicon substrate having at least one circuit device formed therein;
- at least one integrated circuit chip attached to a first side of the substrate and electrically connected to said at least one circuit device; and,
- a microprocessor attached to a second side of the substrate, opposite to said first side, and electrically connected to said at least one integrated circuit chip and said at least one circuit device through at least one opening in said substrate.

21. A chip carrier comprising:
- a silicon substrate;
- at least one integrated circuit chip attached to each of a first and a second opposing sides of the substrate, wherein said integrated circuit chips are electrically connected through at least one opening in said substrate.

22. The chip carrier of claim 21, wherein each of the at least one integrated circuit chips are attached to the substrate by soldering.

23. The chip carrier of claim 21, wherein the at least one integrated circuit chip attached to the first side of the substrate comprises at least one logic chip, and the at least one integrated circuit chip attached to the second side of the substrate comprises at least one memory chip.

24. The chip carrier of claim 21, wherein the at least one integrated circuit chip attached to the first side of the substrate is attached with a first material which is different from a second material used to attach the at least one integrated circuit chip to the second side of the substrate.

25. The chip carrier of claim 21, further comprising at least one circuit device formed within the silicon substrate.

26. The chip carrier of claim 21, wherein conductive regions on said first and second opposing sides of the substrate are connected through the substrate by conductive through holes.

27. The chip carrier of claim 21, wherein a bonding agent is located in the area between the said at least one integrated circuit chips and the substrate.

28. The chip carrier of claim 22, where the soldering comprises micro bump bonding.

29. The chip carrier of claim 23, wherein the at least one logic chip is microprocessor.

30. The chip carrier of claim 24, wherein the first and second materials are solders having different thermal characteristics.

31. The chip carrier of claim 25, wherein the at least one circuit device comprises at least one active circuit device.

32. The chip carrier of claim 25, wherein said at least one circuit device comprises at least one passive circuit device.

33. The chip carrier of claim 25, wherein at least one circuit device is active circuit device formed in said first face.

34. The chip carrier of claim 25, wherein at least one passive circuit device is formed in said second face.

35. The chip carrier of claim 31, wherein said at least one active circuit device comprises a phase locked loop circuit.

36. The chip carrier of claim 32, wherein said at least one passive device comprises at least one of a resistor and a capacitor.

37. The chip carrier of claim 27, wherein said bonding agent is epoxy.

* * * * *